(12) United States Patent
Sun

(10) Patent No.: US 9,812,334 B2
(45) Date of Patent: Nov. 7, 2017

(54) CORROSION METHOD OF PASSIVATION LAYER OF SILICON WAFER

(71) Applicant: CSMC TECHNOLOGIES FAB1 CO., LTD., Wuxi New District (CN)

(72) Inventor: Qiliang Sun, Wuxi New District (CN)

(73) Assignee: CSMC Technologies Fab1 Co., Ltd., Wuxi New District, Jiangsu (CN)

( * ) Notice: Subject to any disclaimer, the term of this patent is extended or adjusted under 35 U.S.C. 154(b) by 0 days.

(21) Appl. No.: 14/436,037

(22) PCT Filed: Dec. 31, 2013

(86) PCT No.: PCT/CN2013/091169
§ 371 (c)(1),
(2) Date: Apr. 15, 2015

(87) PCT Pub. No.: WO2014/117624
PCT Pub. Date: Aug. 7, 2014

(65) Prior Publication Data
US 2015/0270139 A1 Sep. 24, 2015

(30) Foreign Application Priority Data

Jan. 29, 2013 (CN) .......................... 2013 1 0034420

(51) Int. Cl.
*H01L 21/311* (2006.01)
*B81C 1/00* (2006.01)

(52) U.S. Cl.
CPC .... *H01L 21/31116* (2013.01); *B81C 1/00476* (2013.01); *B81C 2201/0132* (2013.01)

(58) Field of Classification Search
CPC ......... H01L 21/31116; H01L 21/02049; H01L 21/31111; B81C 1/00476; B81C 2201/0132
See application file for complete search history.

(56) References Cited

U.S. PATENT DOCUMENTS 5,370,741 A * 12/1994 Bergman .......... H01L 21/67023
134/3
7,686,973 B2 3/2010 Hirano et al.
(Continued)

FOREIGN PATENT DOCUMENTS

CN 1816901 8/2006
CN 1917151 2/2007
(Continued)

OTHER PUBLICATIONS

Kalem et al. (Possibility of fabricating light-emitting porous silicon from gas phase etchants, 2000 Optical Society of America, Jan. 3, 2000 / vol. 6, No. 1 / Optics Express) Bergman (U.S. Pat. No. 5,370,741)(11 pages).*

(Continued)

*Primary Examiner* — Duy Deo
*Assistant Examiner* — Mahmoud Dahimene
(74) *Attorney, Agent, or Firm* — Hamre, Schumann, Mueller & Larson, P.C.

(57) ABSTRACT

A corrosion method of a passivation layer (320) of a silicon wafer (300) includes: pouring hydrofluoric acid solution (100) into a container (200) with an open top; putting the silicon wafer (300) to the opening of the container (200) and one side of the silicon wafer (300) with the passivation layer (320) is opposite to the hydrofluoric acid solution (100); the hydrogen fluoride gas generated from the volatilization of the hydrofluoric acid solution (100) corrodes the passivation layer (320) of the silicon wafer (300), the corrosion time is larger or equal to (thickness of the passivation layer/corrosion rate). By means of the corrosion of the passivation layer of silicon wafer by the fluoride gas generated from the volatilization of the hydrofluoric acid solution, the fluoride gas can fully touch the passivation layer; therefore the (Continued)

passivation layer can be completely corroded, and the corrosion precision is high.

11 Claims, 4 Drawing Sheets

(56) References Cited

U.S. PATENT DOCUMENTS

| | | | |
|---|---|---|---|
| 2009/0267166 A1* | 10/2009 | Verheijden | B81C 1/00476 257/415 |
| 2009/0275202 A1* | 11/2009 | Tanaka | C23C 16/045 438/700 |
| 2011/0124144 A1* | 5/2011 | Schlemm | H01J 37/3244 438/57 |

FOREIGN PATENT DOCUMENTS

| | | |
|---|---|---|
| CN | 201311920 | 9/2009 |
| EP | 1693887 | 8/2006 |
| EP | 1755156 | 2/2007 |
| EP | 1693887 | 8/2008 |
| JP | 2004-335954 | 11/2004 |

OTHER PUBLICATIONS

Office Action dated Jul. 21, 2015 from corresponding Chinese patent application, 3 pages total.
International Search Report for PCT/CN2013/091169, dated Apr. 3, 2014, 5 pages total.

* cited by examiner

CORROSION METHOD OF PASSIVATION LAYER OF SILICON WAFER

FIELD OF THE INVENTION

The present disclosure relates to a technical field of microelectronic processing, and more particularly to a method of corroding a passivation layer of a silicon wafer.

BACKGROUND OF THE INVENTION

In a Micro-electromechanical Systems (MEMS) processing, it is often necessary to remove a dielectric layer from a surface of a silicon wafer, e.g. removing a passivation layer on the bottom of a back cavity of the silicon wafer. The passivation layer can be a silicon dioxide layer or silicon nitride layer. A conventional method of removing the passivation layer on the bottom of a back cavity of the silicon wafer is a wet etching, i.e., using an etching solution to corrode the silicon dioxide or silicon nitride to remove the passivation layer of the silicon wafer. However, since the dimension of the back cavity of the silicon wafer is usually in the nanometer or micrometer scale, the etching solution is difficult to reach the back cavity or infiltrate the surface of the passivation layer completely due to the surface tension of the liquid, such that the passivation layer is difficult to be corroded, which results in some residual of the passivation layer and a lower corrosion accuracy.

SUMMARY OF THE INVENTION

Accordingly, it is necessary to provide a method of corroding a passivation layer of a silicon wafer with a high precision.

A method of corroding a passivation layer of a silicon wafer includes:
 pouring hydrofluoric acid solution into a container having an opening on a top thereof;
 placing the silicon wafer at the opening of the container, one side of the silicon wafer having the passivation layer facing the hydrofluoric acid solution; and
 corroding the passivation layer of the silicon wafer using hydrogen fluoride gas volatilized from the hydrofluoric acid solution;
 wherein a time of the corroding is greater or equal to a ratio of a thickness of the passivation layer to a corrosion rate.

In one embodiment, the time of the corroding is 1.2 times of the ratio of the thickness of the passivation layer to the corrosion rate.

In one embodiment, after placing the silicon wafer at the opening of the container, one side of the silicon wafer having the passivation layer facing the hydrofluoric acid solution, the method further includes: introducing inert gas to a bottom of the hydrofluoric acid solution.

In one embodiment, the inert gas is selected from the group consisting of nitrogen, argon, and helium.

In one embodiment, a flow rate of the inert gas ranges from 0.01 sccm to 1000 sccm.

In one embodiment, a distance between a liquid surface of the hydrofluoric acid solution to the side of the side of the silicon wafer having the passivation layer ranges from 5 cm to 30 cm.

In one embodiment, the hydrofluoric acid solution has a percent concentration by mass of from 20% to 49%.

In one embodiment, the corroding the passivation layer of the silicon wafer using the hydrogen fluoride gas volatilized from the hydrofluoric acid solution is performed in a ventilated environment.

In one embodiment, the silicon wafer seals the opening of the container.

In one embodiment, a number of the silicon wafer is two or more.

In one embodiment, after placing the silicon wafer at the opening of the container, one side of the silicon wafer having the passivation layer facing the hydrofluoric acid solution, the method further comprises: heating the hydrofluoric acid solution.

In one embodiment, the passivation layer is a silicon dioxide layer or silicon nitride layer.

In one embodiment, the passivation layer has a back cavity on the side thereof facing the hydrofluoric acid solution, the hydrogen fluoride gas goes through the back cavity and corrodes the passivation layer.

In one embodiment, the silicon wafer comprises a main body, a first dielectric layer, and a second dielectric layer, the first dielectric layer and the second dielectric layer are located at opposite sides of the main body, the passivation layer is the first dielectric layer, the first dielectric layer faces the hydrofluoric acid solution and is corroded by the hydrogen fluoride gas, the second dielectric layer is not in contact with the hydrogen fluoride gas.

In the forgoing method of corroding the passivation layer of the silicon wafer, the passivation layer of the silicon wafer is corroded using the hydrogen fluoride gas volatilized from the hydrofluoric acid solution. In the conventional wet etching method, the etching solution is difficult to infiltrate the surface of the passivation layer completely due to the surface tension of the liquid, such that the corrosion accuracy is low. In the forgoing method of corroding the passivation layer of the silicon wafer, the hydrogen fluoride gas can be in contact with the passivation layer completely and fully corrode the passivation layer, thus the corrosion accuracy can be improved.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION OF THE EMBODIMENTS

Embodiments of the invention are described more fully hereinafter with reference to the accompanying drawings. The various embodiments of the invention may, however, be embodied in many different forms and should not be construed as limited to the embodiments set forth herein. Rat her, these embodiments are provided so that this disclosure will be thorough and complete, and will fully convey the scope of the invention to those skilled in the art.

Figure 1:
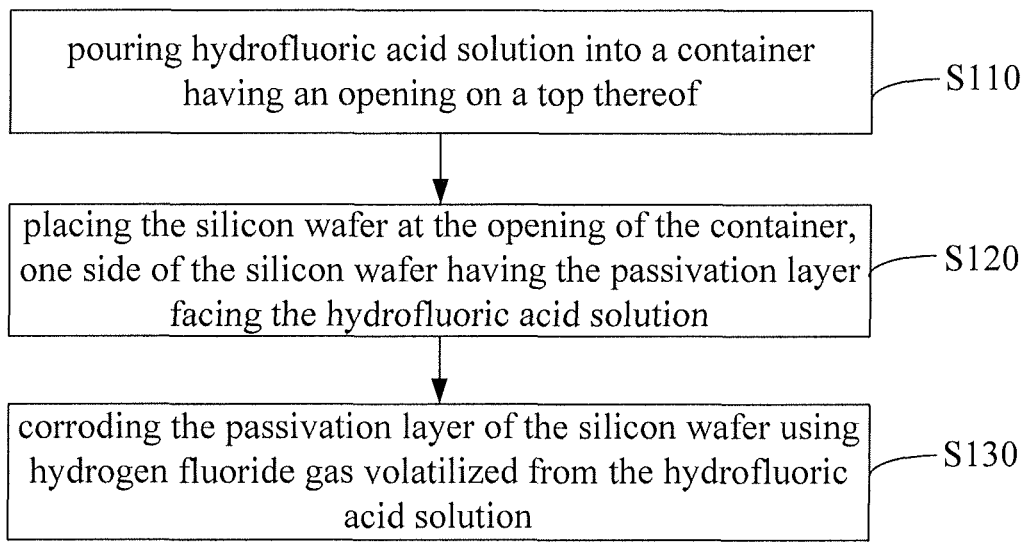
FIG. 1 is a flow chart of an embodiment of a method of corroding a passivation layer of a silicon wafer.

Referring to FIG. 1, an embodiment of a method of corroding a passivation layer of a silicon wafer includes the following steps:

Step S110, hydrofluoric acid solution is poured into a container having an opening on a top thereof.

Figure 2:
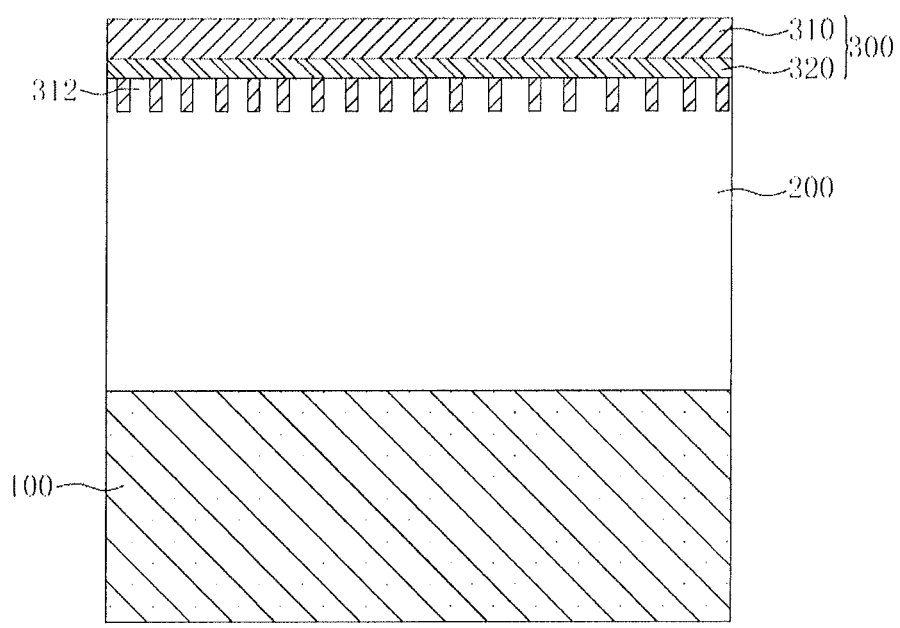
FIG. 2 is a schematic view showing a corroding process of the passivation layer of the silicon wafer according to one embodiment.

FIG. 2 is a schematic view showing a corroding process of the passivation layer of the silicon wafer. A hydrofluoric acid solution 100 is filled in a container 200, which has an opening at the top of the container 200. Since the hydrofluoric acid solution 100 is highly corrosive, the container 200 is made of materials which cannot be corroded by the hydrofluoric acid solution 100, such as polytetrafluoroethylene or the like.

In the illustrated embodiment, the container 200 has the same cross-sectional area from the bottom to the open end thereof. A liquid surface of the hydrofluoric acid solution 100 is lower than a plane located by the open end of the container 200. It is to be understood that, the shape of the container 200 is not limited to that, for example, in alternative embodiments, the cross-sectional area of the bottom of the container 200 can be less than that of the open end of the container 200, as long as the passivation layer to be corroded is placed facing the hydrofluoric acid solution 100 in the container 200.

In one embodiment, the hydrofluoric acid solution has a percent concentration by mass of from 20% to 49%. If a percent concentration by mass is greater than 20%, the hydrofluoric acid solution can be volatile at room temperature, such that the corroding can be carried out at room temperature, thus saving energy.

Since hydrogen fluoride is highly toxic and harmful to the human body, all the operations in the method of corroding the passivation layer of the silicon wafer are performed in a ventilated environment, such that excess hydrogen fluoride vapor can be drained away to ensure the operation safety. For example, the container 200 is placed in a fume hood when carrying out the corroding.

Step S120, the silicon wafer is placed at the opening of the container, and one side of the silicon wafer having the passivation layer faces the hydrofluoric acid solution.

Referring to FIG. 2, the silicon wafer 300 is placed at the top of the container 200 and covers the opening of the container 200. The silicon wafer 300 includes a main body 310 defining a plurality of back cavities 312. The passivation layer 320 is formed between the back cavities 312 and the main body 310. The passivation layer 320 can be a silicon dioxide layer or silicon nitride layer.

One side of the silicon wafer 300 having the passivation layer 320 faces the inside of the container 200 and the hydrofluoric acid solution 100. Hydrogen fluoride gas volatized from the hydrofluoric acid can react with the silicon dioxide or silicon nitride, so as to corrode the silicon dioxide layer or silicon nitride layer.

Since the liquid surface of the hydrofluoric acid solution 100 is lower than the plane located by the open end of the container 200, when the silicon wafer 300 is placed on the top of the container 200, the liquid surface of the hydrofluoric acid solution 100 is lower than the side of the silicon wafer 300 having the passivation layer 320, such that the hydrofluoric acid solution 100 is not in direct contact with the silicon wafer 300, thus avoiding the adverse effects to the silicon wafer 300 by the water in the hydrofluoric acid solution 100.

In the illustrated embodiment, the size of the silicon wafer 300 matches the size of the opening of the container 200, such that the container 200 is sealed when the silicon wafer 300 is placed at the open end of the container 200, so as to reduce the loss of the hydrogen fluoride gas and increase the corrosion rate. During the corrosion, the hydrogen fluoride gas can be in direct contact with the passivation layer 320 and fully corrode the passivation layer 320 without moving the silicon wafer 300, thus rendering a simple operation and higher corrosion efficiency.

Since the container 200 with the opening at the top is used, the silicon wafer 300 can be directly secured to the top of the container 200 without further fixing tools, the operation is simple and the equipment requirement is low.

It is to be understood that, in alternative embodiment, the area of the silicon wafer 300 can be less than that of the opening of the container 200. In that case, other fixing tools may be employed to secure the silicon wafer 300 to the opening of the container 200 and ensure the passivation layer 320 facing the hydrofluoric acid solution 100. In addition, when the size of the silicon wafer 300 is less than that of the opening of the container 200, two or more silicon wafers 300 can be placed at the opening, such that two or more passivation layers of the silicon wafers 300 can be corroded at the same time, thus improving the production efficiency.

Step S130, the passivation layer of the silicon wafer is corroded using hydrogen fluoride gas volatilized from the hydrofluoric acid solution at a room temperature, and a time of the corroding can be a ratio of a thickness of the passivation layer to a corrosion rate.

The silicon wafer 300 is placed at the top of the container 200, such that the hydrogen fluoride gas volatilized from the hydrofluoric acid solution can corrode the passivation layer 320 of the silicon wafer 300. The corrosion time can be greater or equal to a ratio of the thickness of the passivation layer to the corrosion rate.

In one embodiment, in order to ensure a fully corrosion, the corrosion time can be appropriately extended. Specifically, the corrosion time can be 1.2 times of the ratio of the thickness of the passivation layer to the corrosion rate, i.e., the normal corrosion time plus extra 20%. After the corrosion rate is determined according to the operating conditions, the passivation layer 320 of the silicon wafer 300 is corroded at the corrosion rate under the operating conditions.

Specifically, at the conditions that the percent concentration by mass of the hydrofluoric acid solution 100 is 49%, a distance between the passivation layer 320 and the liquid surface of the hydrofluoric acid solution 100 is 15 cm, the passivation layer 320 is made of silicon dioxide, and at the room temperature, the corrosion rate is 1200 Angstrom/min; when the passivation layer 320 is made of silicon nitride, the corrosion rate is 20 Angstrom/min.

In the forgoing method of corroding the passivation layer of the silicon wafer, the passivation layer 320 of the silicon wafer 300 is corroded using the hydrogen fluoride gas volatilized from the hydrofluoric acid solution, such that the problem can be solved that due to the surface tension of the liquid, the etching solution in the conventional wet etching is difficult to infiltrate the surface of the passivation layer 320 completely which results in some residual of the passivation layer 320. In addition, the hydrogen fluoride gas can be in contact with the passivation layer 320 completely and fully corrode the passivation layer 320, thus the corrosion accuracy can be improved.

The hydrogen fluoride gas can go through the back cavity 312 and corrode the passivation layer 320 at the bottom of the back cavity 312, even though the pore size of the back cavity 312 is very small, such as in nano-scale. Normally, in this situation, the conventional etching solution cannot reach the bottom of the back cavity 312 to corrode the passivation layer 320 at the bottom of the back cavity 312.

Figure 3:
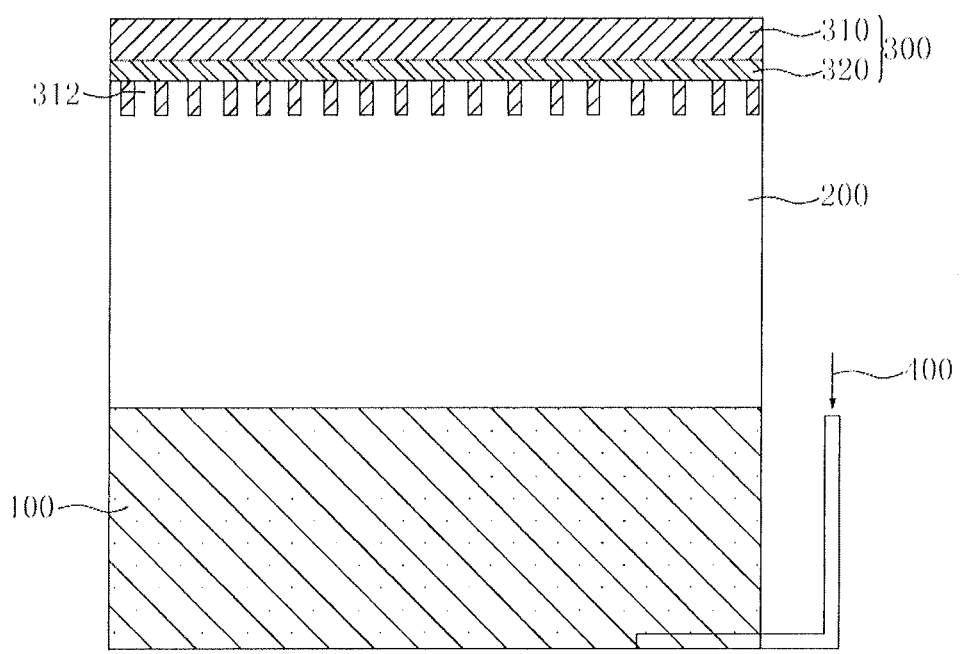
FIG. 3 is a schematic view showing a corroding process of the passivation layer of the silicon wafer according to another embodiment.

In one embodiment, referring to FIG. 3, in order to increase the volatility of hydrofluoric acid to produce more hydrogen fluoride gas for corroding the passivation layer 320 of the silicon wafer 300 and to increase the corrosion rate, inert gas 400 is introduced to a bottom of the container 200.

The inert gas can be nitrogen, argon, or helium. In one embodiment, a flow rate of the inert gas ranges from 0.01 sccm to 1000 sccm. At this flow rate ranges, the evaporation of the hydrogen fluoride is increased, while water drops splashing on the surface of the silicon wafer 300 due to excessive churning to the liquid hydrofluoric acid solution 100 can be avoided.

In one embodiment, a distance between the liquid surface of the hydrofluoric acid solution 100 to the side of the side of the silicon wafer 300 having the passivation layer 320 ranges from 5 cm to 30 cm, which can further prevent the water from splashing on the surface of the silicon wafer 300.

At the conditions that the percent concentration by mass of the hydrofluoric acid solution 100 is in a range from 20% to 49%, a distance between the passivation layer 320 and the liquid surface of the hydrofluoric acid solution 100 is in a range from 5 cm to 30 cm, the flow rate of the inert gas is in a range from 0.01 sccm to 1000 sccm, at the room temperature, the passivation layer 320 is made of silicon dioxide, the corrosion rate is in a range from 1000 Angstrom/min to 1500 Angstrom/min; when the passivation layer 320 is made of silicon nitride, the corrosion rate is in a range from 15 Angstrom/min to 20 Angstrom/min.

In alternative embodiments, the hydrofluoric acid solution 100 in the container 200 can be heated to increase the amount of the hydrogen fluoride gas and improve the efficiency of corrosion. In this case, the hydrofluoric acid solution will become highly volatile by heating, and a large amount of hydrogen fluoride gas can be produced. In one embodiment, if the container 200 having a larger opening cross-sectional area and a less bottom cross-sectional area is used, two or more silicon wafers 300 can be placed at the opening of the container 200 for corroding simultaneously, thus improving the production efficiency.

In one embodiment, the container 200 is heated and a constant temperature of the hydrofluoric acid solution 100 can be maintained, such that a stable corrosion rate can be obtained.

It is to be understood that, the heating to the hydrofluoric acid solution 100 should make sure that the temperature of the hydrofluoric acid solution 100 is controlled to be much lower than the temperature of the boiling point of water and the hydrofluoric acid solution 100, so as to prevent the hydrofluoric acid solution 100 from boiling, the water vapor generated by which will do an adverse effect on the silicon wafer 300 or affect the corrosion rate.

The method of corroding the passivation layer of the silicon wafer has a simple equipment requirement, simple process, and low cost. All steps were carried out in a ventilated environment, thus ensuring the safety.

This method can not only increase the corrosion accuracy, but also can solve the problem that conventional wet etching cannot reach the small deep grooves, and the equipment is simple, the cost is low compared to the dry etching.

The method of corroding the passivation layer of the silicon wafer not only can be applied to the passivation layer 320 at the bottom of the back cavity 312 of the silicon wafer 300, but also can be applied to the silicon dioxide dielectric layer or silicon nitride dielectric layer of the silicon wafer.

Figure 4:
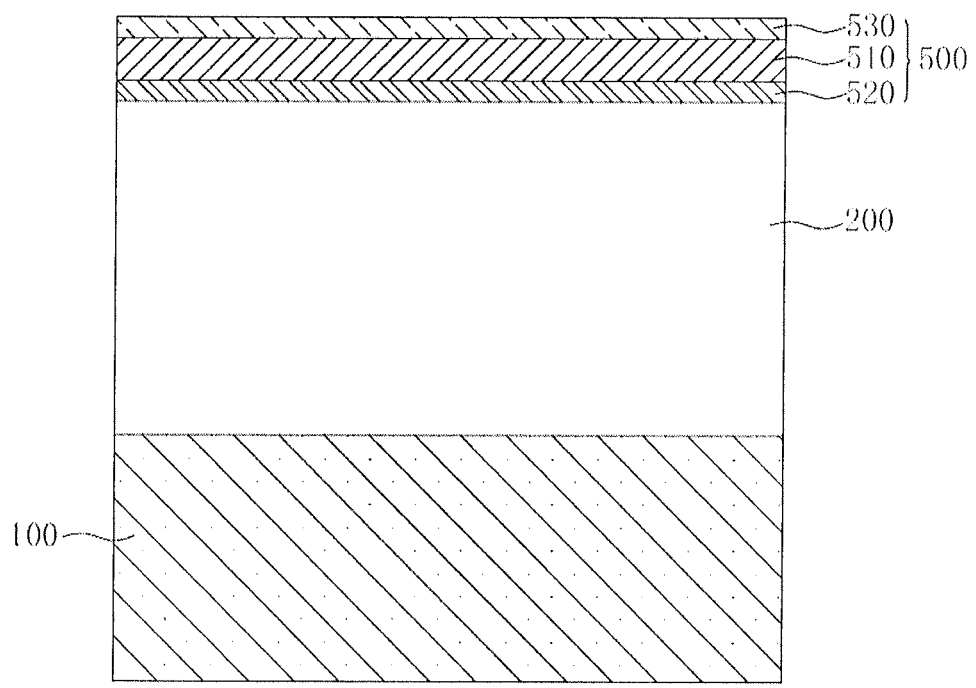
FIG. 4 a schematic view showing a corroding process of the passivation layer of the silicon wafer according to yet another embodiment.

In the conventional wet etching method, the silicon wafer to be corroded is completely immersed in the etching solution to implement the etching, which may, besides corrode the passivation layer, corrode the rest part of the silicon wafer which needs to be preserved. On the contrary, the present method of corroding the passivation layer of the silicon wafer can avoid the unnecessary corrosion to the rest part of the silicon wafer. Referring to FIG. 4, a silicon wafer 500 includes a main body 510, a first dielectric layer 520, and a second dielectric layer 530. The first dielectric layer 520 and the second dielectric layer 530 are located at opposite sides of the main body 510. When the present method of corroding the passivation layer of the silicon wafer is used, the first dielectric layer 520 of the silicon wafer 500 is placed facing the hydrofluoric acid solution 100, such that the hydrogen fluoride gas can corrode the first dielectric layer 520, and the second dielectric layer 530 to be preserved is not in contact with the hydrogen fluoride gas. Accordingly, the second dielectric layer 530 to be preserved will not subject to any adverse effect during the corroding process, thus the product yield is improved.

The method of corroding the passivation layer of the silicon wafer will be further elaborated in company with the following specific examples.

EXAMPLE 1

The corrosion rate was determined via the experiments in advance, and the passivation layer of the silicon wafer was then corroded under the same processing condition. Specific method was described as follows: in a fume hood, a hydrofluoric acid solution with a percent concentration by mass of 49% was poured into a container having an opening on the top thereof. A silicon wafer was placed at the opening of the container, such that one side of the silicon wafer having a passivation layer faced the inside of the container and was opposite to the hydrofluoric acid solution. The passivation layer was made of silicon dioxide with a thickness of 5000 Angstrom. A distance between the liquid surface of the hydrofluoric acid solution and the side of the silicon wafer having the passivation layer was 15 cm. After 5 minutes, the passivation layer of the silicon wafer was corroded by the hydrogen fluoride gas volatilized from the hydrofluoric acid solution with a corrosion rate of 1200 Angstrom/min.

EXAMPLE 2

The corrosion rate was determined via the experiments in advance, and the passivation layer of the silicon wafer was then corroded under the same processing condition. Specific method was described as follows: in a fume hood, a hydrofluoric acid solution with a percent concentration by mass of 35% was poured into a container having an opening on the top thereof. A silicon wafer was placed at the opening of the container, such that one side of the silicon wafer having a passivation layer faced the inside of the container and was opposite to the hydrofluoric acid solution. The passivation layer was made of silicon dioxide with a thickness of 10000 Angstrom. A distance between the liquid surface of the hydrofluoric acid solution and the side of the silicon wafer having the passivation layer was 6 cm. A nitrogen gas with a flow rate of 100 sccm was introduced to the bottom of the container. After 5 minutes, the passivation layer of the silicon wafer was corroded by the hydrogen fluoride gas volatilized from the hydrofluoric acid solution with a corrosion rate of 1500 Angstrom/min.

EXAMPLE 3

The corrosion rate was determined via the experiments in advance, and the passivation layer of the silicon wafer was then corroded under the same processing condition. Specific method was described as follows: in a fume hood, a hydrofluoric acid solution with a percent concentration by mass of 30% was poured into a container having an opening on the top thereof. A silicon wafer was placed at the opening of the container, such that one side of the silicon wafer having a passivation layer faced the inside of the container and was opposite to the hydrofluoric acid solution. The passivation layer was made of silicon nitride with a thickness of 1000 Angstrom. A distance between the liquid surface of the hydrofluoric acid solution and the side of the silicon wafer having the passivation layer was 10 cm. A helium gas with a flow rate of 100 sccm was introduced to the bottom of the container. After 10 minutes, the passivation layer of the silicon wafer was corroded by the hydrogen fluoride gas volatilized from the hydrofluoric acid solution with a corrosion rate of 20 Angstrom/min.

According to the examples described above, after the corrosion rate is predetermined, the passivation layer of the silicon wafer can be fully corroded by setting an appropriate corroding time without affecting other dielectric layers, such that a corrosion effect with high precision can be achieved.

Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

What is claimed is:

1. A method of corroding a passivation layer of a silicon wafer, comprising:
   pouring hydrofluoric acid solution into a container having an opening defined by a rim on a top of the container;
   placing the silicon wafer at the opening of the container, one side of the silicon wafer having the passivation layer facing the hydrofluoric acid solution, the silicon wafer being in direct contact with the rim on the top of the container;
   introducing an inert gas to a bottom of the hydrofluoric acid solution at a bottom of the container from the bottom of the container and heating the hydrofluoric acid solution; and
   corroding the passivation layer of the silicon wafer using hydrogen fluoride gas volatilized from the hydrofluoric acid solution,
   wherein a distance between a liquid surface of the hydrofluoric acid solution and the side of the silicon wafer having the passivation layer ranges 15-30 cm,
   wherein a time of the corroding is greater or equal to a ratio of a thickness of the passivation layer to a corrosion rate; the thickness has a unit of centimeter and the corrosion rate has a unit of angstrom/min; the silicon wafer comprises a main body defining a plurality of back cavities; the passivation layer is formed between the back cavities and the main body; the passivation layer covers the entire surface on the one side of the silicon wafer facing the hydrofluoric acid solution; the passivation layer directly contacts the back cavities and forms a bottom of the back cavities; and the hydrogen fluoride gas goes through the back cavities and corrodes the passivation layer.

2. The method according to claim 1, wherein the time of the corroding is 1.2 times of the ratio of the thickness of the passivation layer to the corrosion rate.

3. The method according to claim 1, wherein the inert gas is selected from the group consisting of argon and helium.

4. The method according to claim 1, wherein a flow rate of the inert gas ranges from 0.01 sccm to 1000 sccm.

5. The method according to claim 1, wherein the hydrofluoric acid solution has a percent concentration by mass of from 20% to 49%.

6. The method according to claim 1, wherein the corroding the passivation layer of the silicon wafer using the hydrogen fluoride gas volatilized from the hydrofluoric acid solution is performed in a ventilated environment.

7. The method according to claim 1, wherein placing the silicon wafer at the opening of the container seals the opening of the container.

8. The method according to claim 1, wherein the number of the silicon wafer is two or more.

9. The method according to claim 1, wherein the passivation layer is a silicon dioxide layer or silicon nitride layer.

10. The method according to claim 1, wherein the passivation layer has a back cavity on the side facing the hydrofluoric acid solution, the hydrogen fluoride gas goes through the back cavity and corrodes the passivation layer.

11. The method according to claim 1, wherein the silicon wafer comprises a main body, a first dielectric layer, and a second dielectric layer, the first dielectric layer and the second dielectric layer are located at opposite sides of the main body, the passivation layer is the first dielectric layer, the first dielectric layer faces the hydrofluoric acid solution and is corroded by the hydrogen fluoride gas, the second dielectric layer is not in contact with the hydrogen fluoride gas.

* * * * *